US007865865B2

(12) United States Patent
Socha

(10) Patent No.: US 7,865,865 B2
(45) Date of Patent: Jan. 4, 2011

(54) METHOD, PROGRAM PRODUCT AND APPARATUS FOR PERFORMING DECOMPOSITION OF A PATTERN FOR USE IN A DPT PROCESS

(75) Inventor: Robert J. Socha, Campbell, CA (US)

(73) Assignee: ASML Masktools B.V., Veldhoven (NL)

( * ) Notice: Subject to any disclaimer, the term of this patent is extended or adjusted under 35 U.S.C. 154(b) by 461 days.

(21) Appl. No.: 11/984,218

(22) Filed: Nov. 14, 2007

(65) Prior Publication Data

US 2008/0184191 A1 Jul. 31, 2008

Related U.S. Application Data

(60) Provisional application No. 60/858,702, filed on Nov. 14, 2006.

(51) Int. Cl.
G06F 17/50 (2006.01)
G03F 1/00 (2006.01)
(52) U.S. Cl. ............................................. 716/21; 430/5
(58) Field of Classification Search ............ 716/19–21; 430/5
See application file for complete search history.

(56) References Cited

U.S. PATENT DOCUMENTS

| | | | | |
|---|---|---|---|---|
| 4,797,842 | A * | 1/1989 | Nackman et al. | 716/20 |
| 5,969,441 | A | 10/1999 | Loopstra et al. | |
| 8,311,319 | | 10/2001 | Tu et al. | |
| 6,792,590 | B1 | 9/2004 | Pierrat et al. | |
| 7,010,776 | B2 * | 3/2006 | Gallatin et al. | 716/19 |
| 7,343,582 | B2 * | 3/2008 | Mukherjee et al. | 716/19 |
| 7,512,927 | B2 * | 3/2009 | Gallatin et al. | 716/19 |
| 2003/0140328 | A1 * | 7/2003 | Cobb et al. | 716/19 |
| 2004/0003357 | A1 * | 1/2004 | Palusinski et al. | 716/5 |
| 2005/0091014 | A1 | 4/2005 | Gallatin et al. | |
| 2005/0255411 | A1 | 11/2005 | Frost et al. | |
| 2006/0085773 | A1 * | 4/2006 | Zhang | 716/4 |
| 2006/0271905 | A1 * | 11/2006 | Mukherjee et al. | 716/21 |
| 2006/0277522 | A1 * | 12/2006 | Shi et al. | 716/21 |
| 2007/0031740 | A1 | 2/2007 | Chen et al. | |
| 2007/0065733 | A1 * | 3/2007 | Chen et al. | 430/5 |
| 2007/0072097 | A1 | 3/2007 | Chen | |
| 2007/0157154 | A1 * | 7/2007 | Socha | 716/21 |
| 2007/0214448 | A1 * | 9/2007 | Hsu et al. | 716/19 |
| 2008/0092106 | A1 | 4/2008 | Hsu et al. | |

(Continued)

OTHER PUBLICATIONS

Singapore Search Report issued in Oct. 2, 2008 in corresponding Singapore application.

(Continued)

*Primary Examiner*—Stacy A Whitmore
(74) *Attorney, Agent, or Firm*—Pillsbury Winthrop Shaw Pittman LLP

(57) ABSTRACT

A method of decomposing a target pattern containing features to be printed on a wafer into multiple patterns. The method includes the steps of: (a) defining a region of influence which indicates the minimum necessary space between features to be imaged; (b) selecting a vertex associated with a feature of the target pattern; (c) determining if an edge of another feature is within the region of influence with respect to the vertex; and (d) splitting the another feature into two polygons if the edge of another feature is within the region of influence.

18 Claims, 26 Drawing Sheets

U.S. PATENT DOCUMENTS

2008/0189672 A1     8/2008    Shin et al.
2010/0031225 A1*   2/2010    Ivansen ........................ 716/21

OTHER PUBLICATIONS

Huckabay, J., et al., "Process Results Using Automatic Pitch Decomposition and Double Patterning Technology at kleff ,0.20", *Proc of the SPIE, SPIE*, Bellingham, VA, Oct. 2006, vol. 6349 II, pp. 1-11.

Lim, et al., "Positive and Negative Tone Doubled Patterning Lithography for 50nm Flash Memory", *Proc of SPIE- The Int'l Soc. For Optical Engineering-Optical Microlithograph XIX*, Feb. 21, 2006, vol. 6154, pp. 1-8.

Park J., et al., "Application Challenges With Double Patterning Technology Beyond 45nm", *Proc of the SPIE, SPIE*, Bellingham, VA, vol. 6349 II, Oct. 2006, pp. 1-12.

Toyama, N., et al., "Pattern Decomposition for Double Patterning From Photomask Viewpoint", *Proc. Of SPIE—Int's Soc. For Opt. Eng. Design Manufact. Through Design-Process Integration*, Feb. 28, 2007, vol. 6521, pp. 1-10.

Van Oosten, et al., "Pattern Split Rules a Feasibility Study of Rule Based Pitch Decomposition for Double Patterning", *Proc. Of SPIE—Int's Soc. For Opt. Eng.*, Sep. 2007, vol. 6730, pp. 1-8.

European Search Report issued May 15, 2009 in coresponding EP 07 25 4461.

* cited by examiner

METHOD, PROGRAM PRODUCT AND APPARATUS FOR PERFORMING DECOMPOSITION OF A PATTERN FOR USE IN A DPT PROCESS

RELATED APPLICATIONS

This application claims priority to U.S. Patent Application Ser. No. 60/858,702, filed on Nov. 14, 2006, which is incorporated by reference herein in its entirety.

TECHNICAL FIELD

The technical field of the present invention relates generally to a method, program product and apparatus for performing decomposition of a target pattern so as to allow the target pattern to be imaged utilizing double patterning technology (DPT).

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). As the critical dimensions of the target patterns become increasingly smaller, it is becoming increasingly harder to reproduce the target patterns on the wafer. However, there are known techniques that allow for a reduction in the minimum CD that can be imaged or reproduced in a wafer. One such technique is the double exposure technique wherein features in the target pattern are imaged in two separate exposures.

One such technique, referred to as double patterning technology, allows the features of a given target pattern to be separated into two different masks and then imaged separately to form the desired pattern. Such a technique is typically utilized when the target features are spaced so closely together that it is not possible to image the individual features. In such a situation, as noted, the target features are separated into two masks such that all the features on a given mask are spaced sufficiently apart from one another so that each feature may be individually imaged. Then, by imaging both masks in a sequential manner (with the appropriate shielding), it is possible to obtain the target pattern having the densely spaced features that could not be properly imaged utilizing a single mask.

When utilizing double patterning technology (DPT), polygons in a design may need to be split into multiple polygons. These multiple polygons are subsequently assigned to one of two (or more) masks for imaging (this assignment process is also referred to as coloring). Current fragmentation/splitting algorithms can be quite complex and time consuming. For example, rule-based splitting algorithms have been utilized, however the number of rules necessary to handle today's complex designs can become prohibitively large. Moreover, often times there are situations/conflicts within the design for which no rule has been defined, and such instances can result in the algorithm failing to find a suitable result.

It is an object of the present invention to overcome such deficiencies in known decomposition processes for double exposure techniques.

SUMMARY OF THE INVENTION

In view of the foregoing, it is an object of the present invention to overcome the deficiencies of known prior art techniques by providing a fragmentation process for decomposing or fragmenting the features of a target pattern into distinct segments which can be imaged separately, for example, by utilizing multiple masks in a multiple illumination process.

More specifically, the present relates to a method of decomposing a target pattern containing features to be printed on a wafer into multiple patterns. The method includes the steps of: (a) defining a region of influence which indicates the minimum necessary space between features to be imaged; (b) selecting a vertex associated with a feature of the target pattern; (c) determining if an edge of another feature is within the region of influence with respect to the vertex; and (d) splitting the another feature into two polygons if the edge of another feature is within the region of influence.

The present invention provides important advantages over the prior art. Most importantly, the present invention provides a simple and efficient fragmentation process for decomposing the features of a target pattern into distinct polygons, which eliminates the problems associated with prior art rule-based fragmentation processes.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The invention itself, together with further objects and advantages, can be better understood by reference to the following detailed description and the accompanying drawings.

DETAILED DESCRIPTION OF THE INVENTION

The pattern fragmentation process of the present invention provides a method for splitting polygons of a target pattern into multiple polygons, which are subsequently colored in the DPT process. As explained in further detail below, the method splits a polygon into multiple polygons by fragmenting edges created by convex vertices in negative areas of the pattern and by fragmenting edges created by concave vertices in positive areas of the target pattern. The fragmentation process entails extending a ray (or vector) from each vertex until the ray intersects another vertex or edge. This intersection may cause a split in a neighboring polygon if the neighboring polygon is within a region of influence (ROI) with the vertex from which the ray emanates. The process of determining whether or not the given polygon is split is set forth below. It is noted that the target pattern is preferably described in a data format, such as "gds", which is a standard data format. However, any other suitable data format can also be utilized.

Figure 1:
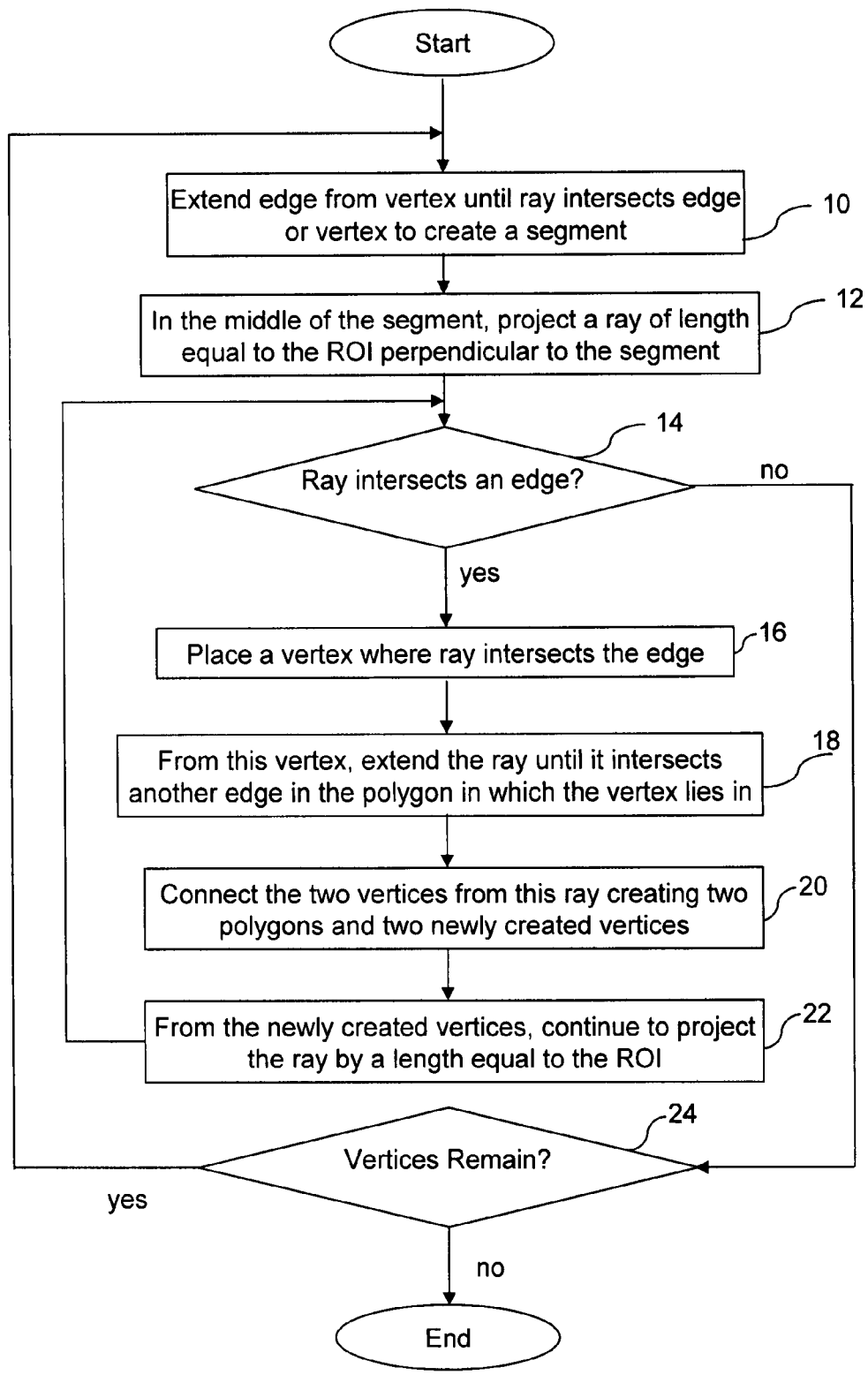
FIG. 1 is an exemplary flowchart illustrating the fragmentation process of the present invention, which is utilized to decompose a target pattern into multiple segments, which are subsequently colored and utilized in a multiple illumination process.

FIG. 1 is an exemplary flowchart illustrating the fragmentation process of the present invention which is utilized to decompose a target pattern into multiple segments. Referring to FIG. 1, the first step in the process (Step 10) is to extend an edge (i.e., ray or vector) from a given vertex of a feature in the target pattern until the ray intersects an edge or vertex of another feature, thereby forming a segment. In other words, Step 10 entails calculating the length of the segment from the beginning vertex to the intersection of the neighboring vertex or edge.

Then, in the next step (Step 12), the segment formed in Step 10 is divided in half, and a point is placed at the middle of the segment. Starting from this point, another ray or vector with a length equivalent to the defined region of influence (ROI) is generated/drawn perpendicular to this segment. The ROI essentially defines the minimum space necessary between features to allow features to be imaged in the same mask. The ROI is preferably set optically and is set, for example, to $k_1 \lambda/NA$, where $k_1$ is the minimum $k_1$ to print features on one exposure (typically greater than $k_1 > 0.31$), $\lambda$ is the wavelength associated with the illumination source, and NA is the numerical aperture. By setting the ROI optically, it assures that no neighboring edge less than (or within) the ROI will be on the same exposure.

Returning to FIG. 1, the next step in the process (Step 14) is to determine if the ray extending from the middle of the segment intersects another edge. If the ray extending from the middle of the segment does not intersect another edge, the ray is ignored as it cannot cause a split in a neighboring feature/polygon, and the process proceeds to Step 24 to determine if there are any additional vertices in the target pattern to be processed. If there are no additional vertices to be processed, the fragmentation process is complete.

However, if the ray does intersect another edge, which means the other edge is within the ROI with respect to the initial feature, the process proceeds to Step 16 and a new vertex is placed on the edge at the position that the ray intersects the edge. This edge corresponds to an adjacent feature/polygon in the target pattern.

Next, in Step 18, the ray is extended (continuing in the same direction) from the newly placed vertex until it intersects another edge, which will be an edge in the same polygon in which the newly placed vertex lies. An additional new vertex is positioned at this intersection. Next, in Step 20, the two newly positioned vertexes are connected together, thereby separating the polygon/feature into two polygons, with the two polygons sharing an edge formed by the ray. It is noted that these two newly formed polygons can be assigned different colors (and therefore to different masks) in a subsequent coloring process.

As noted, in addition to forming two polygons, the two new vertices are formed. In the next step (Step 22), from the newly created last vertex, the ray is continued to be projected in the same direction with a length equivalent to the ROI, and the process returns to Step 14 and repeats the process steps noted above. It is noted that once both extensions from a vertex are evaluated, the vertex is removed from further consideration.

Figure 2:
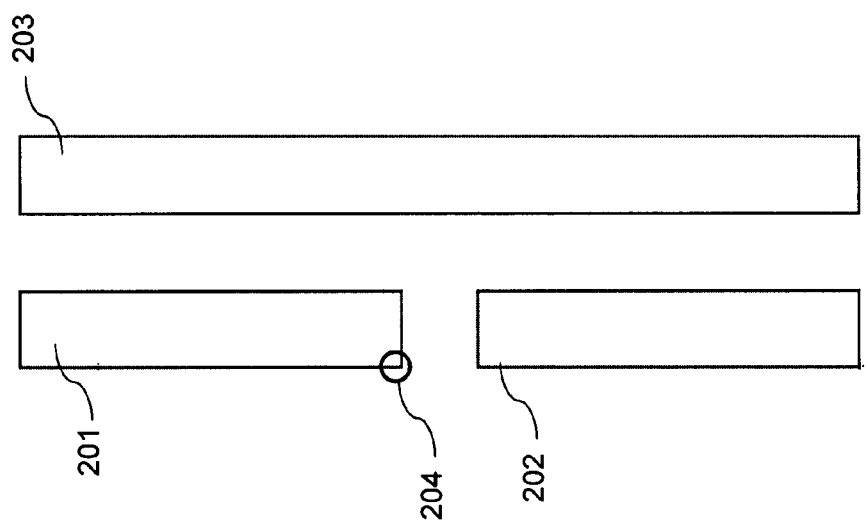
FIGS. 2-10 illustrate a first example of the application of the fragmentation process of the present invention to an exemplary target pattern.

FIGS. 2-10 illustrate a first example of the application of the foregoing fragmentation process to an exemplary target pattern. FIG. 2 illustrates an exemplary target pattern having three polygons/features 201, 202 and 203. A first vertex 204 of the target pattern is selected. As noted above, all of the vertexes formed by the features of the target pattern are processed/analyzed in the foregoing process. This can be accomplished by processing the features contained in the target pattern (and vertexes contained therein) in a right to left manner. However, other methods are also acceptable.

Figure 3:
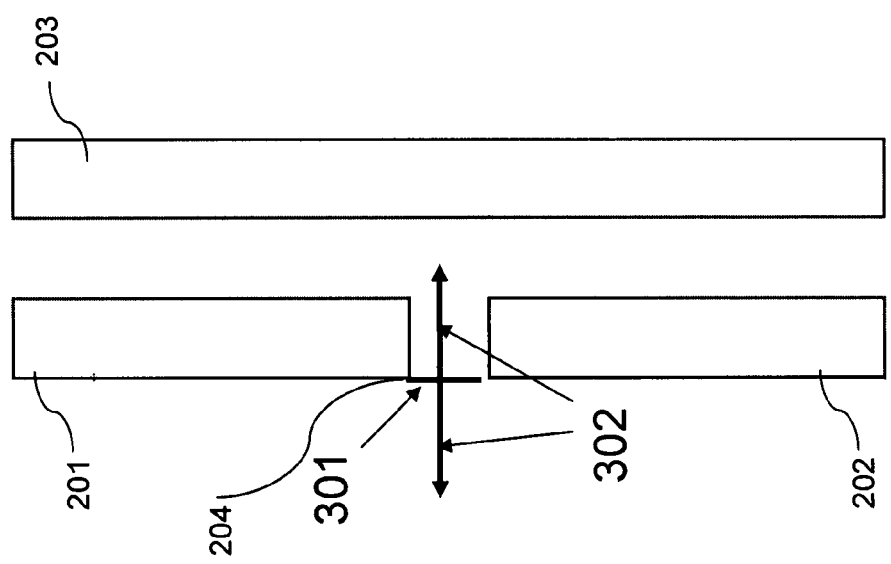

FIG. 3 illustrates the processes of Steps 10 and 12, in which a segment 301 is extended from the edge of vertex 204 until the segment intersects another edge or vertex, which in this example is a vertex associated with feature 202. Then, a ray 302 is generated, which extends from the midpoint of the segment 301 in both directions by a distance equal to the ROI. As shown in FIG. 3, ray 302 does not contact any edge within the distance defined by the ROI, so no further action is necessary with respect to vertex 204 and the process proceeds to analyze the next vertex, which is vertex 205.

Figure 4:
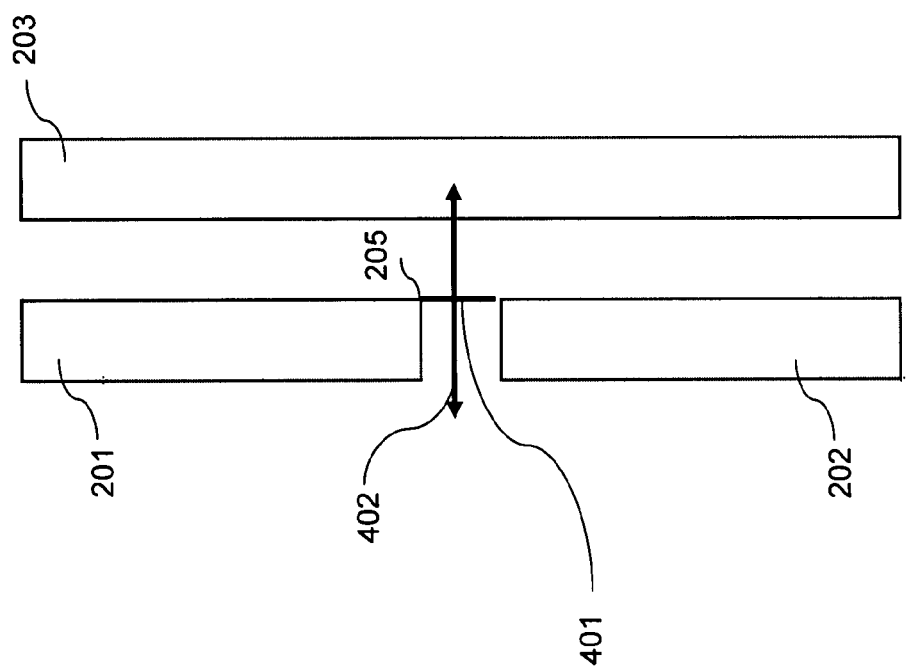
Figure 5:
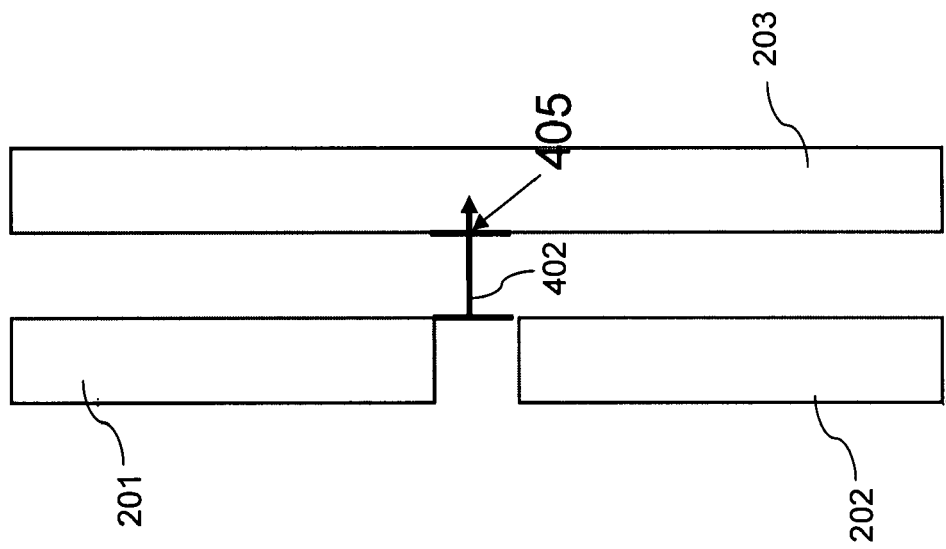
Figure 6:
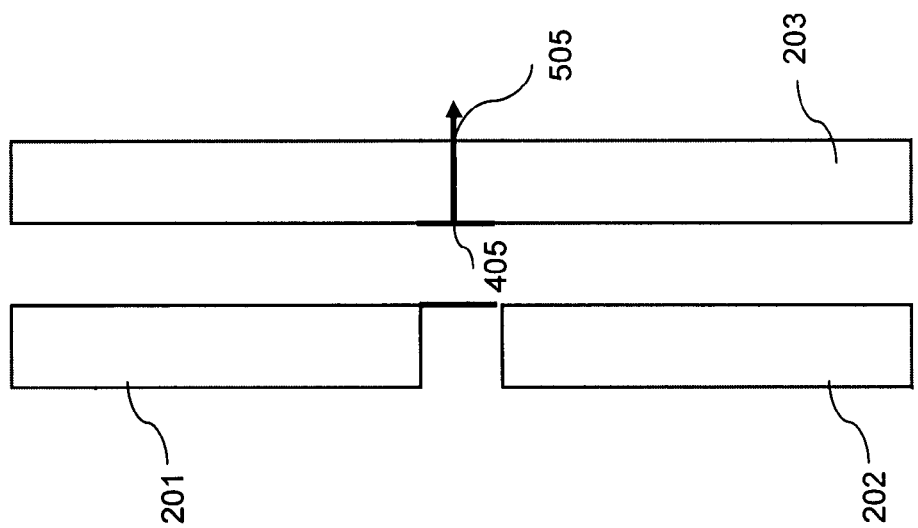
Figure 7:
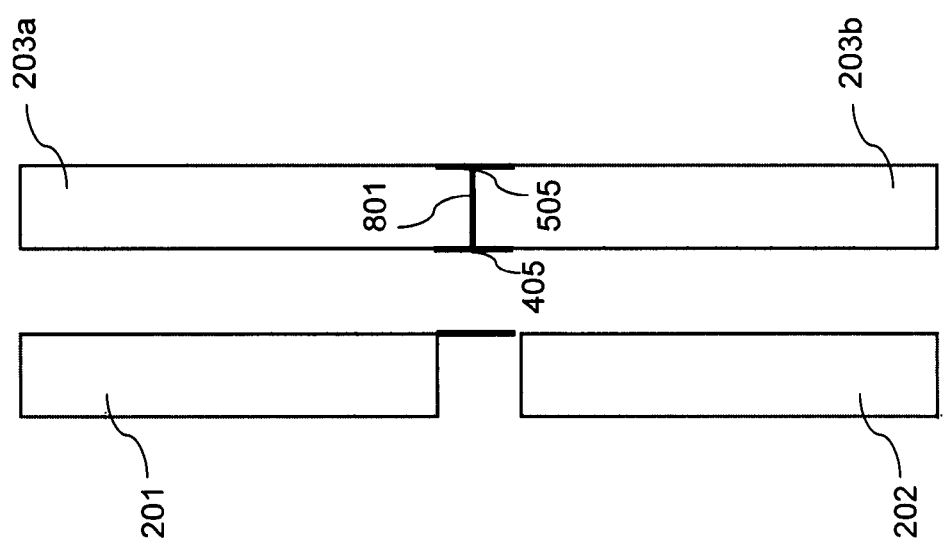
Figure 8:
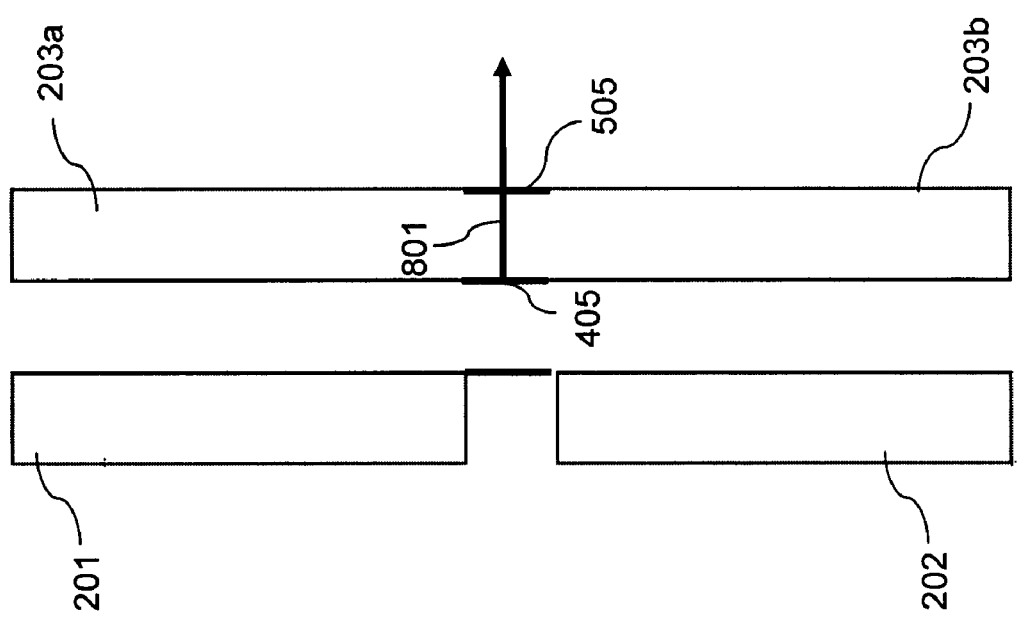
Figure 9:
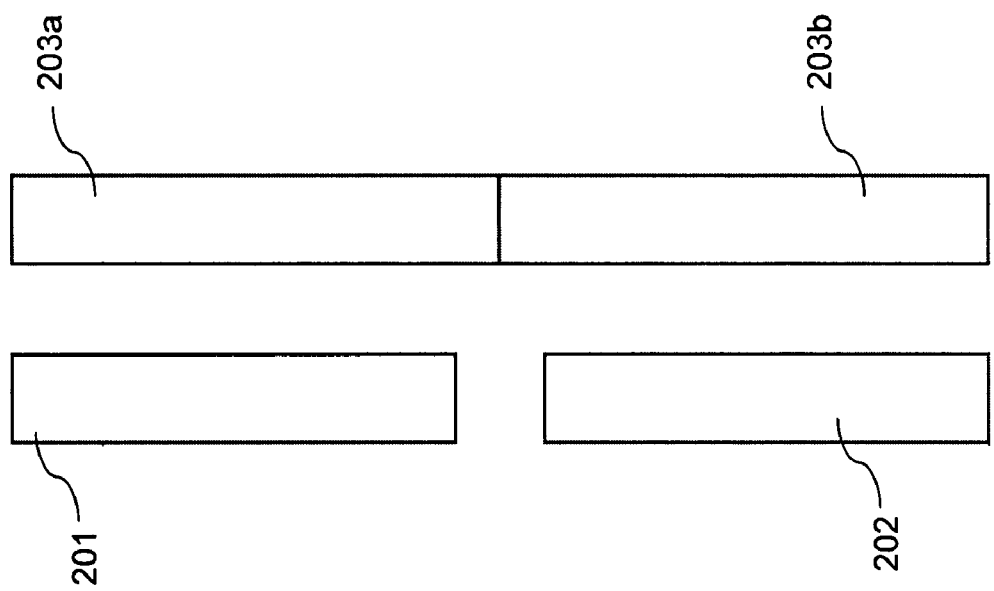
Figure 10:
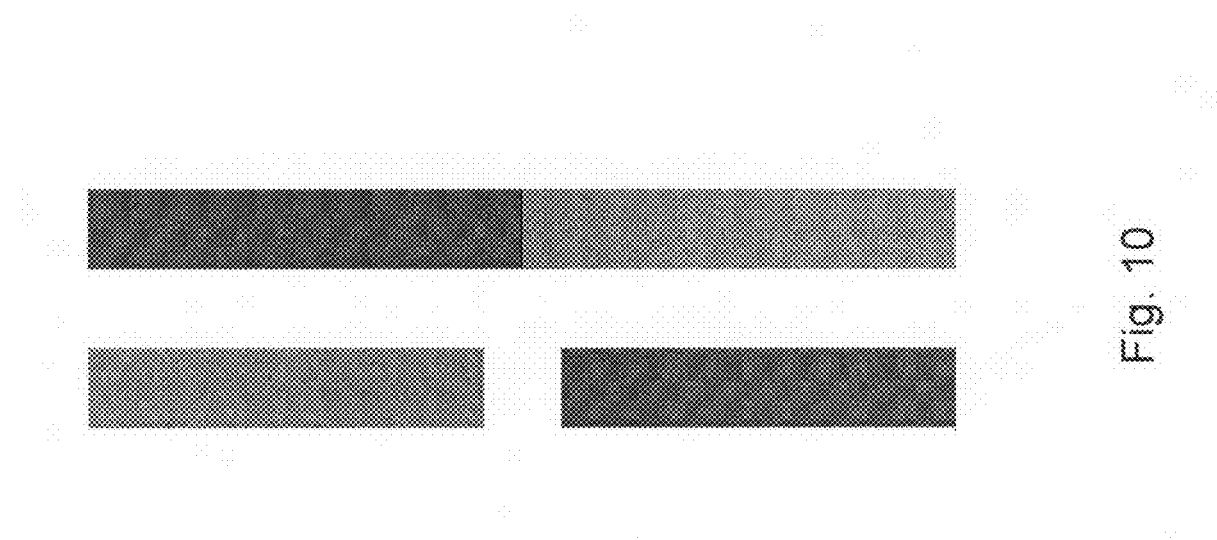

With regard to processing vertex 205, in the same manner, a segment 401 is extended from the edge of vertex 205 until the segment intersect another edge or vertex, which in this example is a vertex associated with feature 202. Next, a ray 402 is generated, which extends from the midpoint of the segment in both directions by a distance equal to the ROI. As shown in FIG. 4, ray 402 contact an edge associated with feature 203, which is within the distance defined by the ROI. In accordance with the process, as shown in FIG. 5, a vertex 405 is placed at the location of the intersection, and then the ray is extended in the same direction until it intersects another edge, which also forms part of polygon 203. As shown in FIG. 6, another vertex 505 is placed at the location of this intersection. The two newly formed vertexes 405 and 505 are then connected as shown in FIG. 7 by edge 801 so as to form two distinct polygons 203*a* and 203*b*. Next, the ray is further extended from vertex 505 by a distance equal to the ROI as shown in FIG. 8, and the foregoing process is repeated. In the given example, the extended ray does not intersect any additional polygons so the process is complete and the result is that the three original polygons/features of the target pattern have been fragmented into four polygons as shown in FIG. 9, each of which that can be separately colored in a subsequent coloring process. FIG. 10 illustrates one possible coloring scheme for the four polygons.

Figure 11:
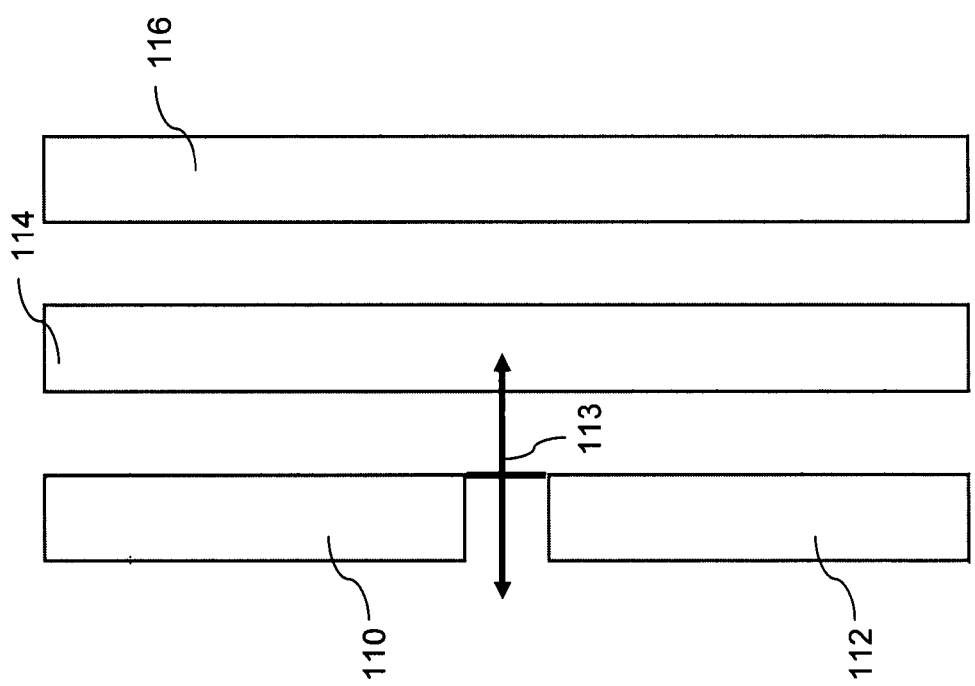
FIGS. 11-17 illustrate a second example of the application of the fragmentation process of the present invention to an exemplary target pattern.
Figure 12:
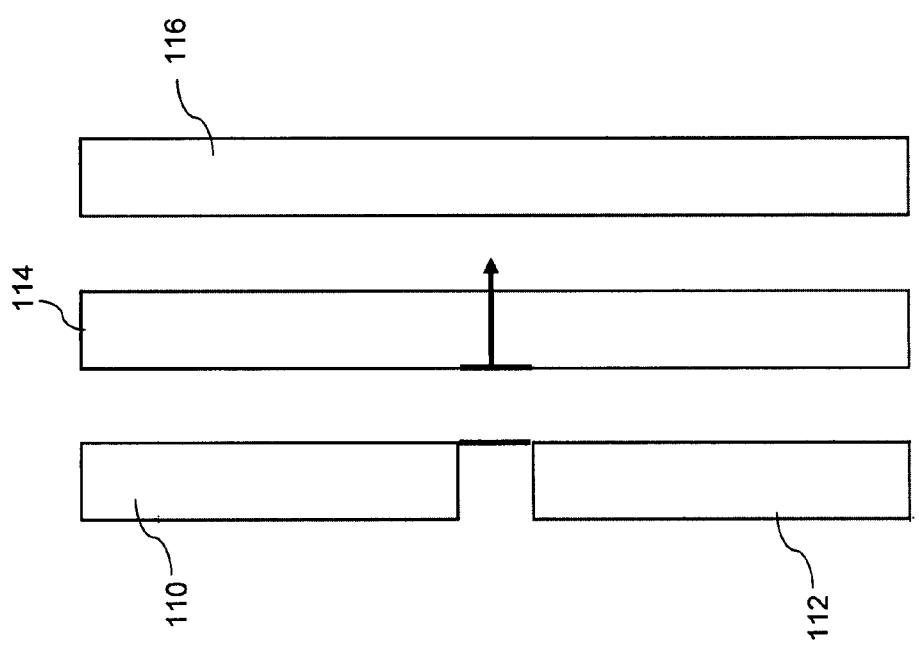
Figure 13:
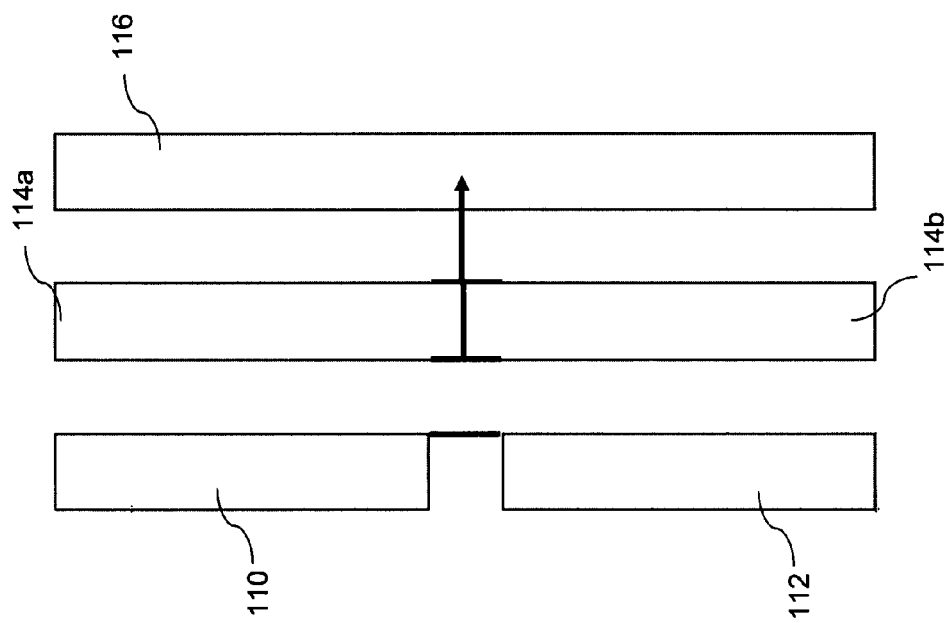
Figure 14:
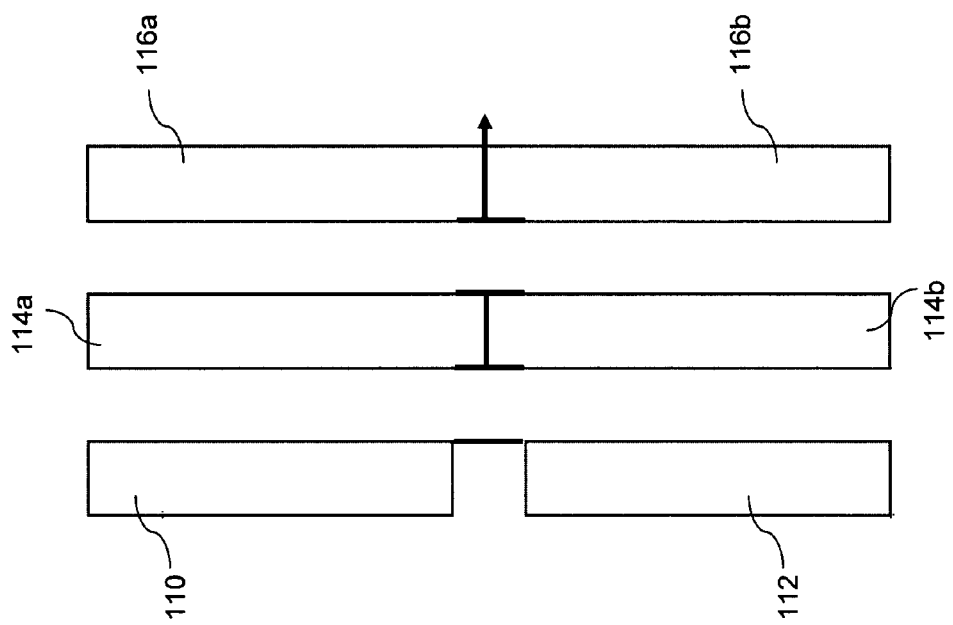
Figure 15:
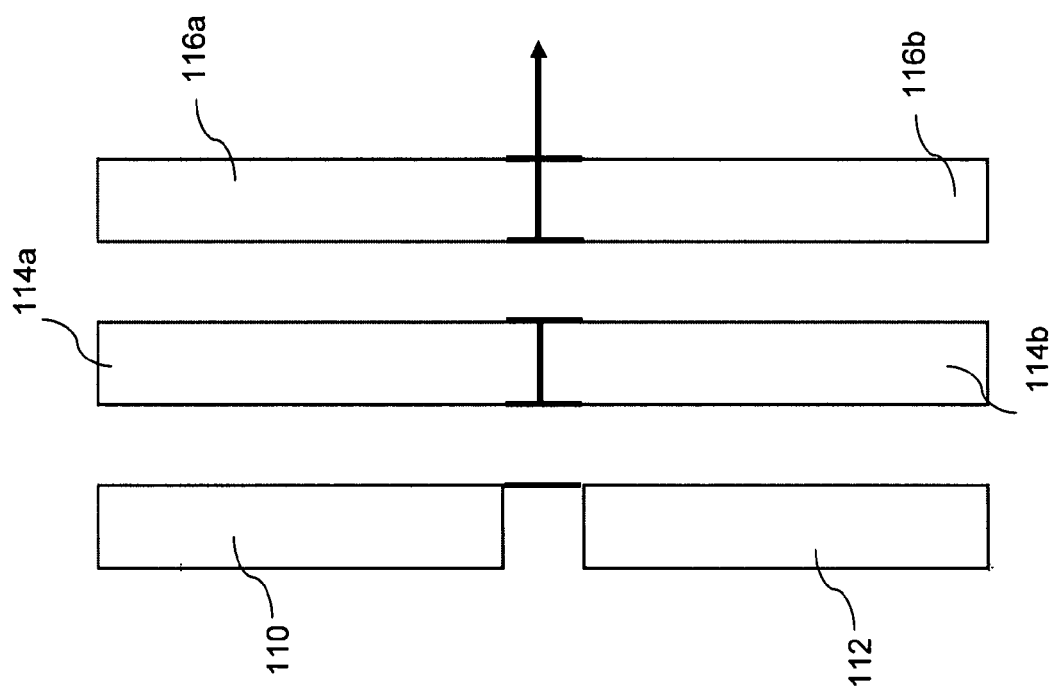
Figure 16:
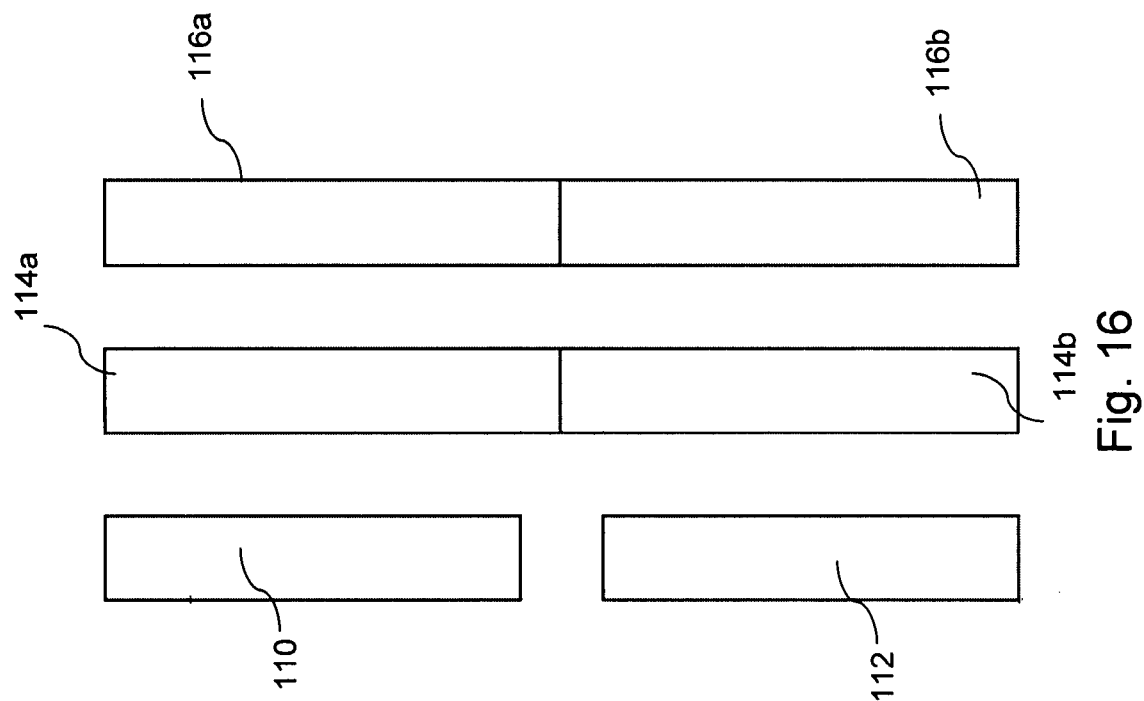
Figure 17:
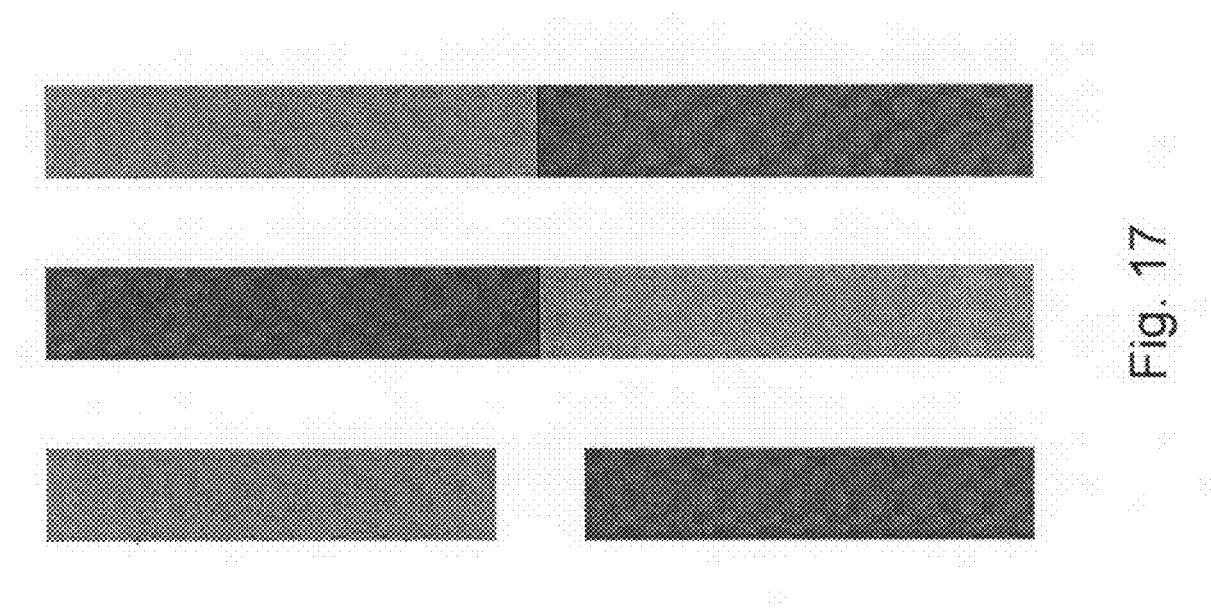
Figure 18:
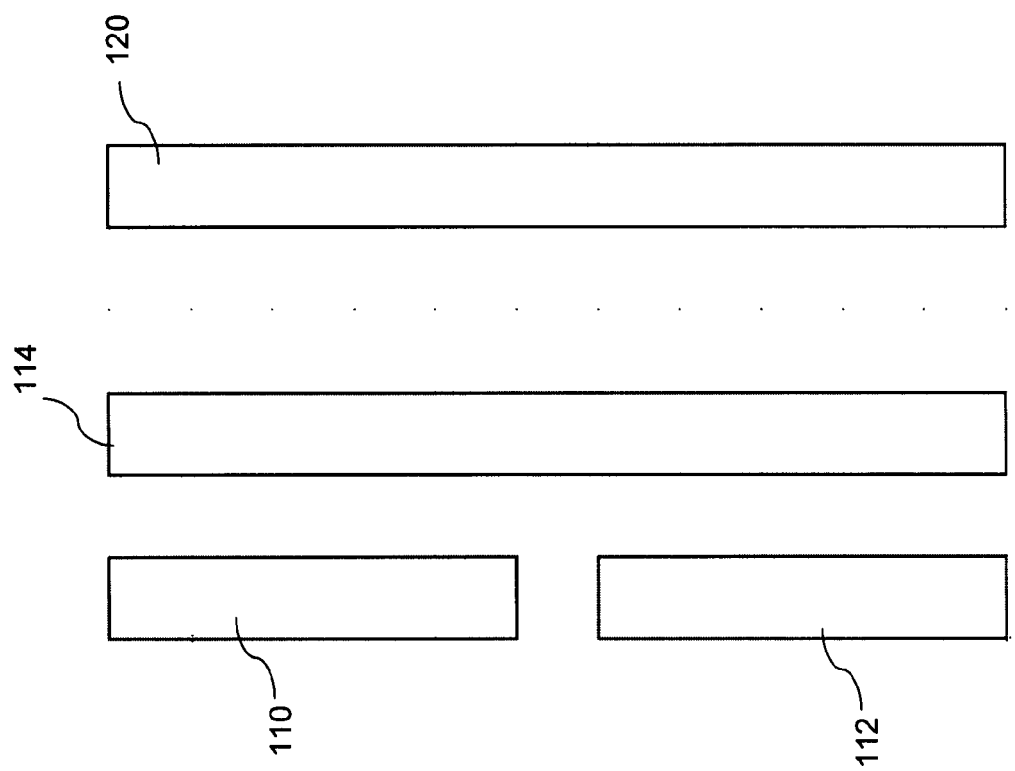
FIGS. 18-24 illustrate a third example of the application of the fragmentation process of the present invention to an exemplary target pattern.
Figure 19:
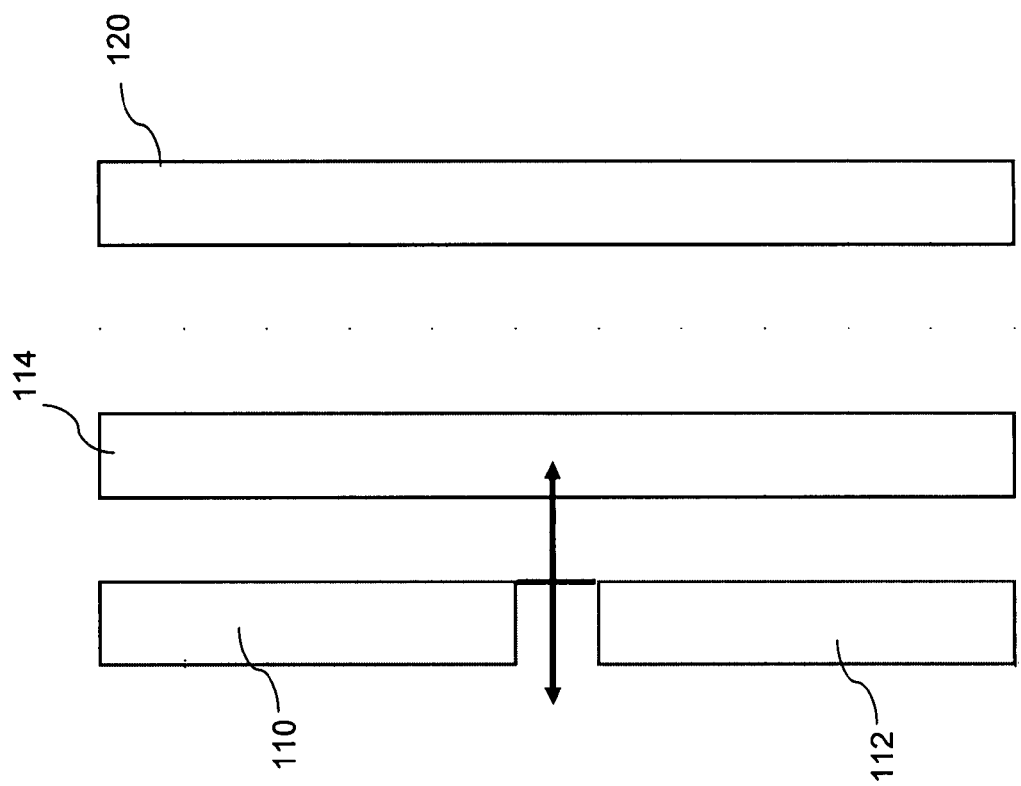
Figure 20:
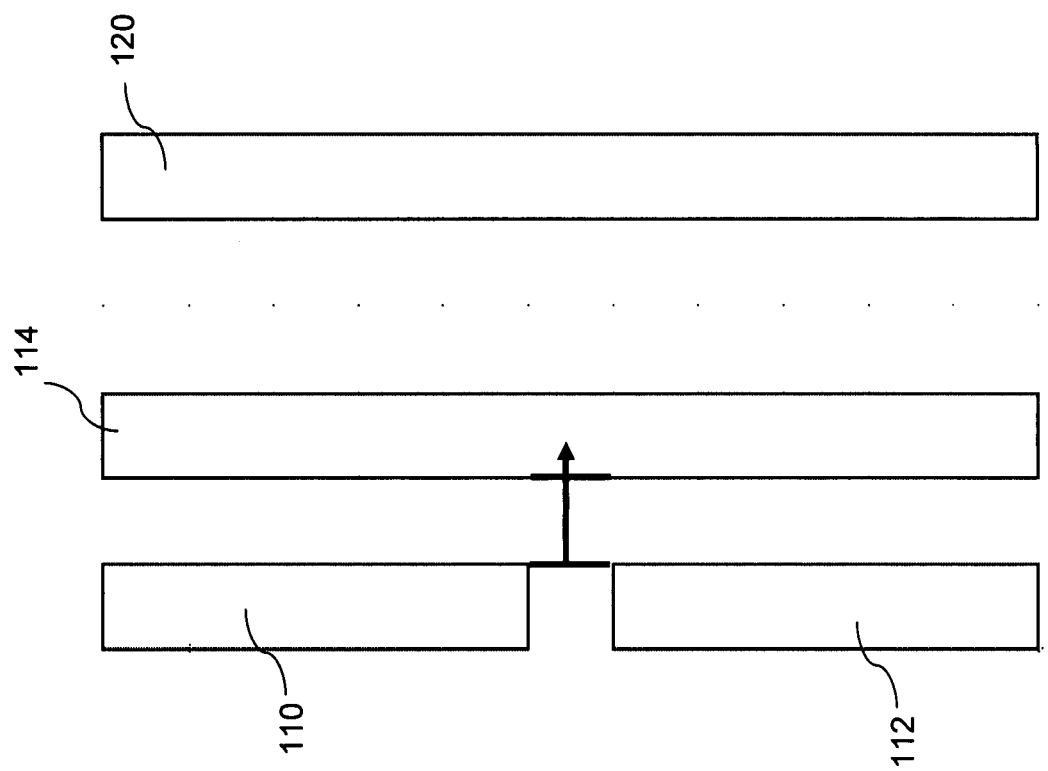
Figure 21:
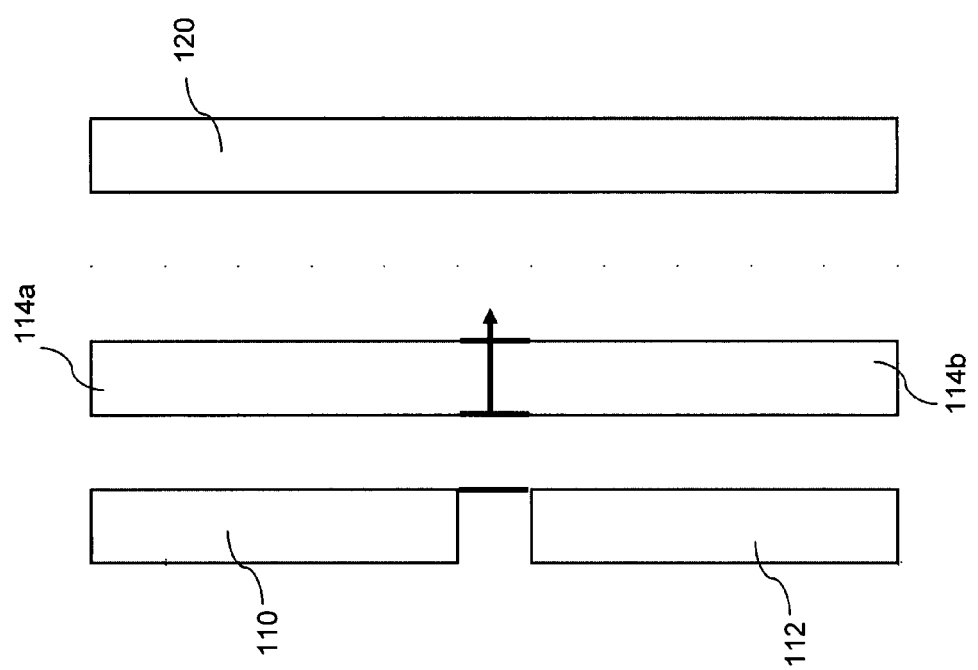

FIGS. 11-17 illustrate a second example of fragmenting a target pattern in accordance with the foregoing method. The target pattern of FIG. 11 includes four features/polygons 110, 112, 114 and 116. As shown in FIG. 11, applying the fragmentation process, the ray 113 intersects polygon 114 within the predefined ROI, which results in polygon 114 being split into two polygons 114*a* and 114*b* as shown in FIGS. 12 and 13. The ray is further extended from the second vertex added to polygon 114 by a distance of ROI in the direction of polygon 116. As shown in FIG. 13, the ray also intersects polygon 116. Applying the fragmentation process, this results in polygon 116 being split into two polygons as shown in FIG. 14. As there are no additional features, the further extension of the ray beyond polygon 116 does not result in an intersection of an additional feature as shown in FIG. 15. The resulting fragmentation is shown in FIG. 16, which illustrates six distinct polygons, 110, 112, 114*a*, 114*b*, 116*a* and 116*b*. FIG. 17 illustrates one possible coloring scheme for the six polygons.

Figure 22:
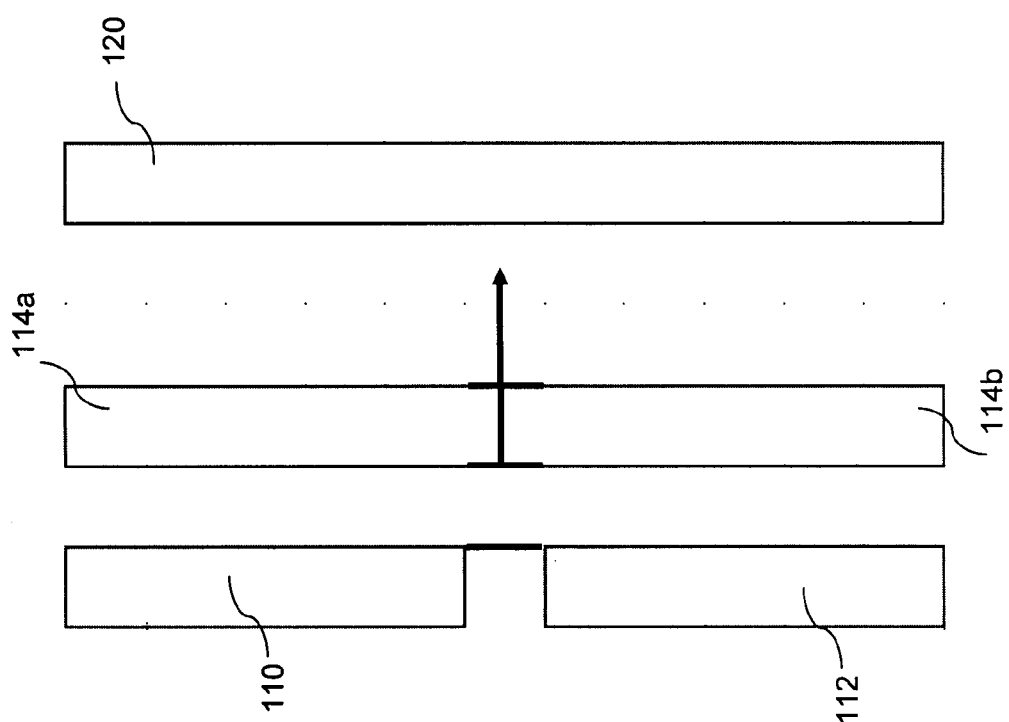
Figure 23:
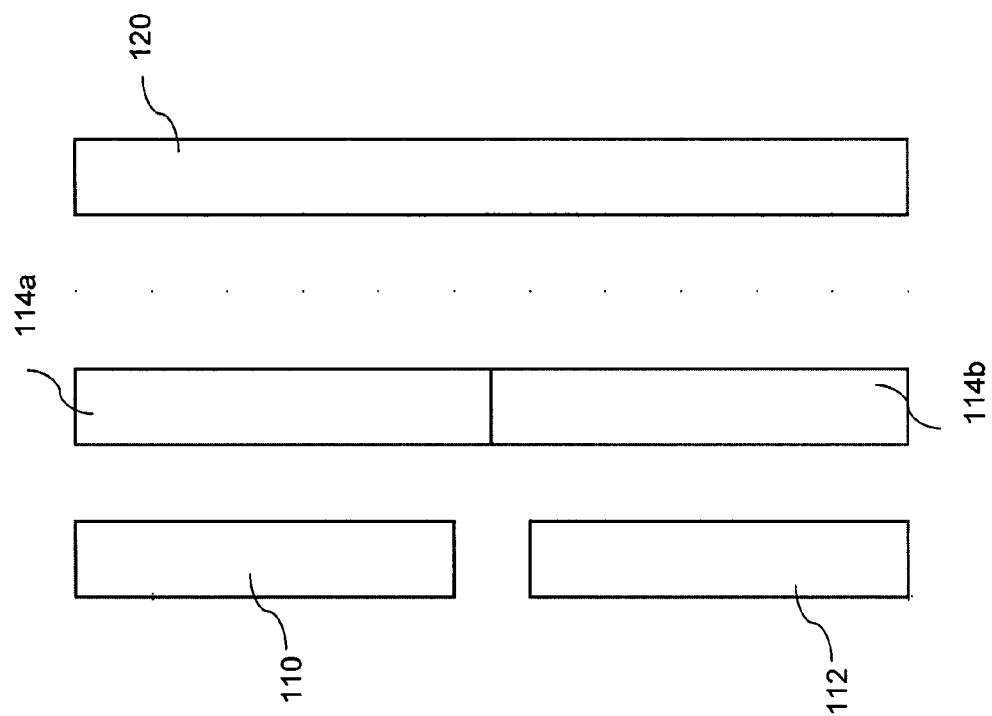
Figure 24:
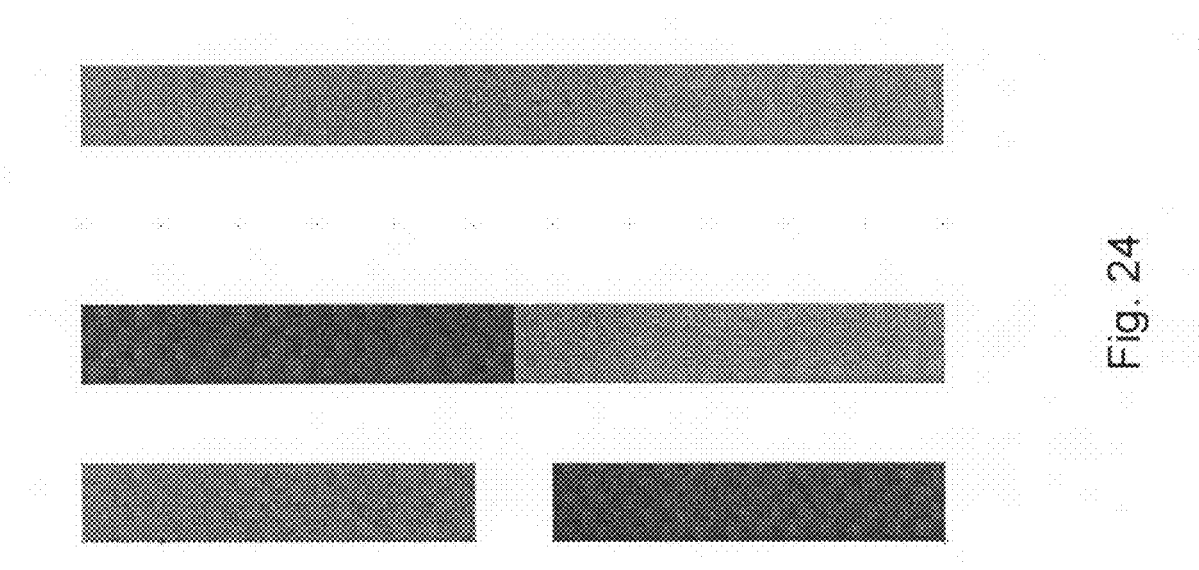

FIGS. 18-24 illustrate a variation of the example shown in FIGS. 11-17. Specifically, the first three features 110, 112 and 114 of the target pattern are the same as those shown in FIG. 11, and as a result, these polygons are fragmented in the same manner. However, as shown in this example, feature 120 is outside of the ROI relative to feature 114. As such, the fragmentation process does not split feature 120 and feature 120 can be assigned to either color scheme. FIGS. 18-24 illustrate the fragmentation process applied to this target pattern. As shown in FIG. 22, feature 120 is outside the ROI with respect to feature 114, and therefore feature 120 is not fragmented. FIG. 23 illustrates the final fragmentation and FIG. 24 illustrates one possible color scheme for the fragmented pattern.

It is noted that the foregoing fragmentation algorithm is applied to all vertices of the target pattern. Further, all vertices (i.e., convex and concave) are treated equally. There is no selection criteria to trigger the creation of a ray from a vertex. If the rays created by vertices intersect within a polygon, multiple polygons are created. For example, large landing pad type polygons that are near vertices can be broken into multiple polygons. If there are many vertices near a large polygon, it may actually form a checker board type pattern. Rays are also extended in both a horizontal and vertical direction from a given vertex during the segment formation step. It is further noted that small jogs in the edges that create vertices can be either ignored or included for polygon creation. The vertices created by a jog are considered small if the jog forms an edge with a length less than an order of magnitude of the ROI, $(k_1 \lambda)/(10 NA)$.

As noted above, after the polygons are formed by the fragmentation process a coloring algorithm is applied. The coloring algorithm splits a design into multiple exposures (i.e., separate masks). This coloring algorithm can be performed utilizing either a rule based approach or a model based approach. The coloring algorithm, however, should group polygons together for each exposure, i.e., to fuse the polygons together for each exposure. The grouping is done such that edges of the polygons for one exposure are neighboring as many edges as possible in other polygons. Coloring conflicts are resolved by minimizing the intersection of edges on multiple exposures. Mathematically, it should satisfy the following criteria:

$\min\{A_i \cap B_i\}$ where A is an edge in exposure one and B is an edge in exposure two.

This criteria above is subject to two constraints when there are only two exposures.

1. $(A_j - A_{i \neq j}) > ROI$ for all $i \neq j$ where A is an edge for exposure one, and 2. $(B_j-B_{i \neq j})$>ROI for all i≠j where B is an edge for exposure two The criteria above can be extended to include more than two exposures. For more than two exposures, another criteria similar to minimization of edge intersection is added, such that the number of edges between exposures is minimized for all exposures. Furthermore, another constraint similar to criteria 1 and 2 is added for each exposure beyond two.

Variations of the foregoing process are also possible. For example, it is possible to determine the ROI by a simulation process or experimental data based on the given process to be utilized for imaging the target pattern. Such simulation or experimental data will also indicate the minimum allowable space between features necessary for the features to image properly for the given process.

As noted above, the present invention provides important advantages over the prior art. Most importantly, the present invention provides a simple and efficient fragmentation process for decomposing the features of a target pattern into distinct polygons, which eliminates the problems associated with prior art rule-based fragmentation processes.

Figure 25:
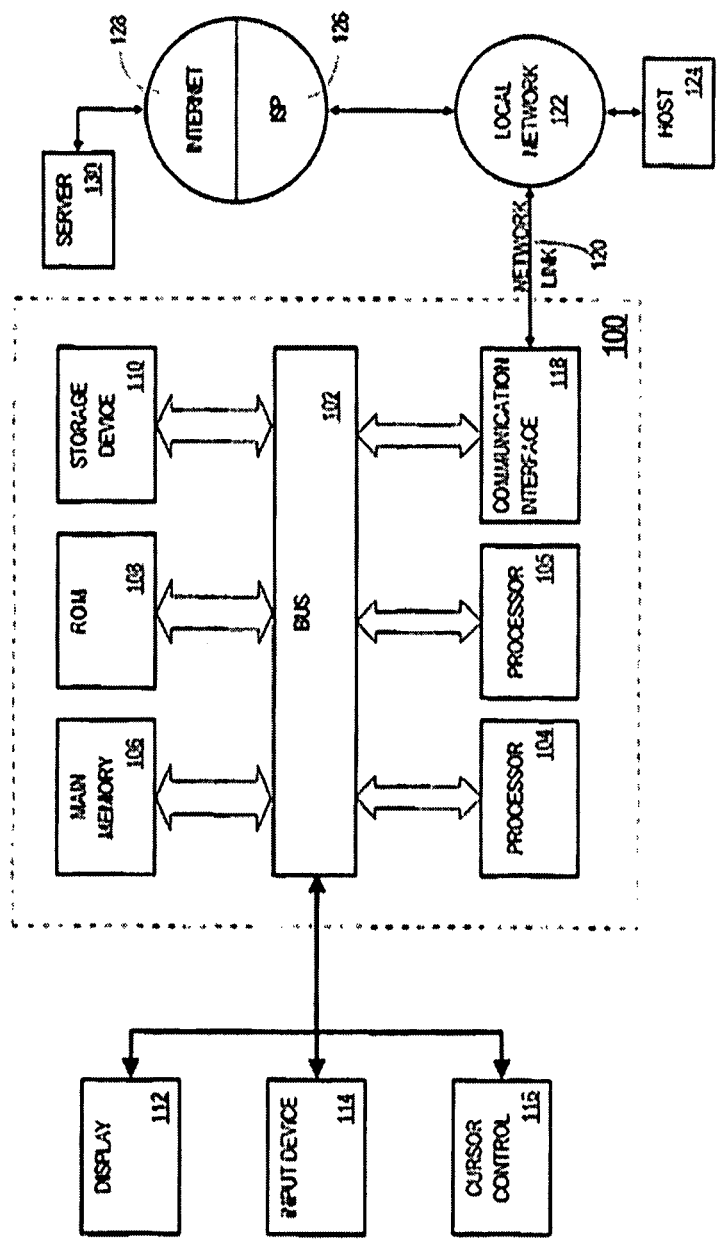
FIG. 25 is a block diagram that illustrates a computer system which can implement fragmentation process of the present invention.

FIG. 25 is a block diagram that illustrates a computer system 100 which can implement the fragmentation process explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the coloring process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, and volatile media. Non-volatile media include, for example, optical or magnetic disks, such as storage device 110. Volatile media include dynamic memory, such as main memory 106. Common forms of computer-readable media include, for example, a floppy disk, a flexible disk, hard disk, magnetic tape, any other magnetic medium, a CD-ROM, DVD, any other optical medium, a RAM, a PROM, and EPROM, a FLASH-EPROM, any other memory chip or cartridge, or any other medium from which a computer can read.

One or more sequences can be involved in providing one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 26:
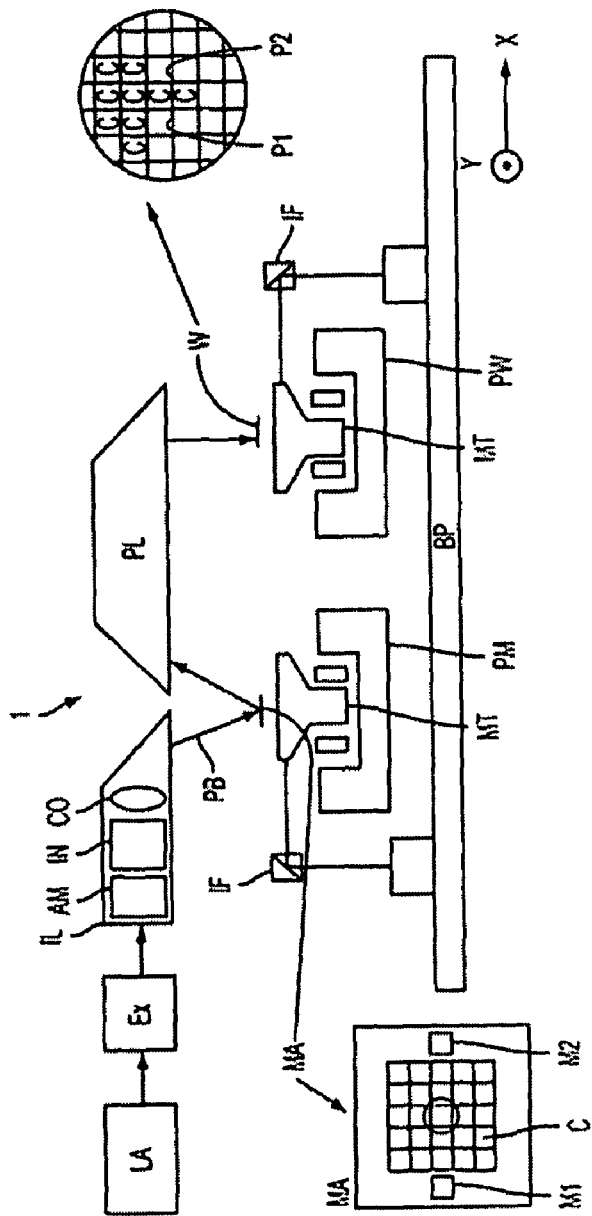
FIG. 26 schematically depicts an exemplary lithographic projection apparatus suitable for use with a mask designed with the aid of the disclosed concepts.

FIG. 26 schematically depicts a lithographic projection apparatus suitable for use with a mask designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 26 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 26. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A computer-implemented method for decomposing a target pattern containing features to be printed on a wafer, into multiple patterns to be imaged separately, comprising the steps of:
    (a) defining a region of influence which indicates the minimum necessary space between features to be imaged;
    (b) selecting a vertex associated with a feature of said target pattern,
    (c) determining by the computer, if an edge of another feature is within said region of influence with respect to said vertex; and
    (d) splitting said another feature into two polygons for separate inclusion into different ones of said multiple patterns if said edge of another feature is within said region of influence.

2. The method of claim 1, further comprising the step of repeating steps (b)-(d) such that each vertex of each feature of said target pattern is analyzed.

3. The method of claim 1, wherein said region of influence is defined by the formula $k_1 \lambda/NA$, where $k_1$ is the minimum $k_1$ to print features in a single exposure, $\lambda$ is the wavelength associated with the illumination source, and NA is the numerical aperture.

4. The method of claim 1, wherein said region of influence is determined by at least one of a simulation process or actual experimental imaging data.

5. The method of claim 1, wherein step (c) comprises the steps of:
    extending a segment from said vertex until said segment intersects at least one of an edge or vertex of one of said features; and
    extending a ray from a middle portion of said segment by a length equal to said region of influence.

6. A non-transitory computer readable medium bearing a computer program for decomposing a target pattern containing features to be printed on a wafer, into multiple patterns to be imaged separately, the computer program, when executed, causing a computer to perform the steps of:

(a) defining a region of influence which indicates the minimum necessary space between features to be imaged;

(b) selecting a vertex associated with a feature of said target pattern, (c) determining if an edge of another feature is within said region of influence with respect to said vertex; and (d) splitting said another feature into two polygons for separate inclusion into different ones of said multiple patterns if said edge of another feature is within said region of influence.

7. The computer readable medium of claim 6, further comprising the step of repeating steps (b)-(d) such that each vertex of each feature of said target pattern is analyzed.

8. The computer readable medium of claim 6, wherein said region of influence is defined by the formula $k_1\lambda/NA$, where $k_1$ is the minimum $k_1$ to print features in a single exposure, $\lambda$ is the wavelength associated with the illumination source, and NA is the numerical aperture.

9. The computer readable medium of claim 6, wherein said region of influence is determined by at least one of a simulation process or actual experimental imaging data.

10. The computer readable medium of claim 6, wherein step (c) comprises the steps of:

extending a segment from said vertex until said segment intersects at least one of an edge or vertex of one of said features; and extending a ray from a middle portion of said segment by a length equal to said region of influence.

11. A device manufacturing method comprising the steps of:

(a) providing a substrate that is at least partially covered by a layer of radiation-sensitive material;

(b) providing a projection beam of radiation using an imaging system;

(c) using a target pattern on a mask to endow the projection beam with a pattern in its cross-section;

(d) projecting the patterned beam of radiation onto a target portion of the layer of radiation-sensitive material, wherein, in step (c), said mask is formed by a method comprising the steps of:

(e) defining a region of influence which indicates a minimum necessary space between features of said target pattern to be imaged;

(f) selecting a vertex associated with a feature of said target pattern, (g) determining if an edge of another feature is within said region of influence with respect to said vertex; and (h) splitting said another feature into two polygons for separate inclusion into different ones of said multiple patterns to be imaged separately if said edge of another feature is within said region of influence.

12. A computer-implemented method for generating masks to be imaged separately in a photolithography process, said method comprising the steps of:

(a) defining a region of influence which indicates a minimum necessary space between features of a target pattern to be imaged;

(b) selecting a vertex associated with a feature of said target pattern, (c) determining, by the computer, if an edge of another feature is within said region of influence with respect to said vertex; and (d) splitting said feature into two polygons for separate inclusion into different ones of said multiple patterns if said edge of another feature is within said region of influence.

13. The method of claim 12, further comprising the step of repeating steps (b)-(d) such that each vertex of each feature of said target pattern is analyzed.

14. The method of claim 12, wherein said region of influence is defined by the formula $k_1\lambda/NA$, where $k_1$ is the minimum $k_1$ to print features in a single exposure, $\lambda$ is the wavelength associated with the illumination source, and NA is the numerical aperture.

15. The method of claim 12, wherein said region of influence is determined by at least one of a simulation process or actual experimental imaging data.

16. The method of claim 12, wherein step (c) comprises the steps of:

extending a segment from said vertex until said segment intersects at least one of an edge or vertex of one of said features; and extending a ray from a middle portion of said segment by a length equal to said region of influence.

17. A mask generated utilizing the method of claim 1.

18. A mask generated utilizing the method of claim 12.

* * * * *

UNITED STATES PATENT AND TRADEMARK OFFICE
CERTIFICATE OF CORRECTION

| | | |
|---|---|---|
| PATENT NO. | : 7,865,865 B2 | Page 1 of 1 |
| APPLICATION NO. | : 11/984218 | |
| DATED | : January 4, 2011 | |
| INVENTOR(S) | : Robert J. Socha | |

It is certified that error appears in the above-identified patent and that said Letters Patent is hereby corrected as shown below:

On title page, item (56) References Cited - U.S. Patent Documents
replace "8,311,319"
with --6,311,319--.

Signed and Sealed this
Seventeenth Day of May, 2011

David J. Kappos
*Director of the United States Patent and Trademark Office*